United States Patent
Li et al.

(10) Patent No.: US 12,120,905 B2
(45) Date of Patent: Oct. 15, 2024

(54) DISPLAY PANEL, METHOD FOR MANUFACTURING SAME, AND DISPLAY DEVICE WITH IMPROVED STRESS ABSORBING CAPACITY

(71) Applicants: Chengdu BOE Optoelectronics Technology Co., Ltd., Sichuan (CN); BOE Technology Group Co., Ltd., Beijing (CN)

(72) Inventors: Shaopeng Li, Beijing (CN); Tianjun Deng, Beijing (CN); Junhao Ai, Beijing (CN); Xiaolong Tang, Beijing (CN); Xinfeng Zhou, Beijing (CN); Cheng Zhang, Beijing (CN); Weiben Zhang, Beijing (CN); Rongkun Fan, Beijing (CN); Ren Xiong, Beijing (CN); Wenze Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 17/512,554

(22) Filed: Oct. 27, 2021

(65) Prior Publication Data
US 2022/0238838 A1    Jul. 28, 2022

(30) Foreign Application Priority Data
Jan. 25, 2021    (CN) .......................... 202110097392.8

(51) Int. Cl.
*H10K 50/844*    (2023.01)
*H10K 71/00*    (2023.01)
*H10K 77/10*    (2023.01)
*H10K 59/12*    (2023.01)
*H10K 102/00*    (2023.01)

(52) U.S. Cl.
CPC .......... *H10K 50/844* (2023.02); *H10K 71/00* (2023.02); *H10K 77/111* (2023.02); *H10K 59/12* (2023.02); *H10K 2102/311* (2023.02)

(58) Field of Classification Search
CPC .... H10K 50/844; H10K 71/00; H10K 77/111; H10K 2102/311
USPC .......................................................... 257/88
See application file for complete search history.

(56) References Cited

U.S. PATENT DOCUMENTS

2018/0190936 A1*  7/2018  Lee ........................... B32B 3/18
2020/0185641 A1*  6/2020  Jeong .................. H10K 77/111

* cited by examiner

*Primary Examiner* — Quoc D Hoang
(74) *Attorney, Agent, or Firm* — IPro, PLLC

(57) ABSTRACT

Provided is a display panel. The display panel includes a drive backplane and a stress absorbing layer. The drive backplane includes a pixel circuit region and a peripheral region disposed outside the pixel circuit region, the peripheral region including a bending region; wherein the bending region and the pixel circuit region are sequentially arranged along a first direction, and the bending region is provided with at least one isolation trench arranged along a second direction, the at least one isolation trench extend through the drive backplane. The stress absorbing layer includes a plurality of absorbing portions, at least one of the plurality of absorbing portions being provided on both sides of each of the at least one isolation trench.

16 Claims, 4 Drawing Sheets

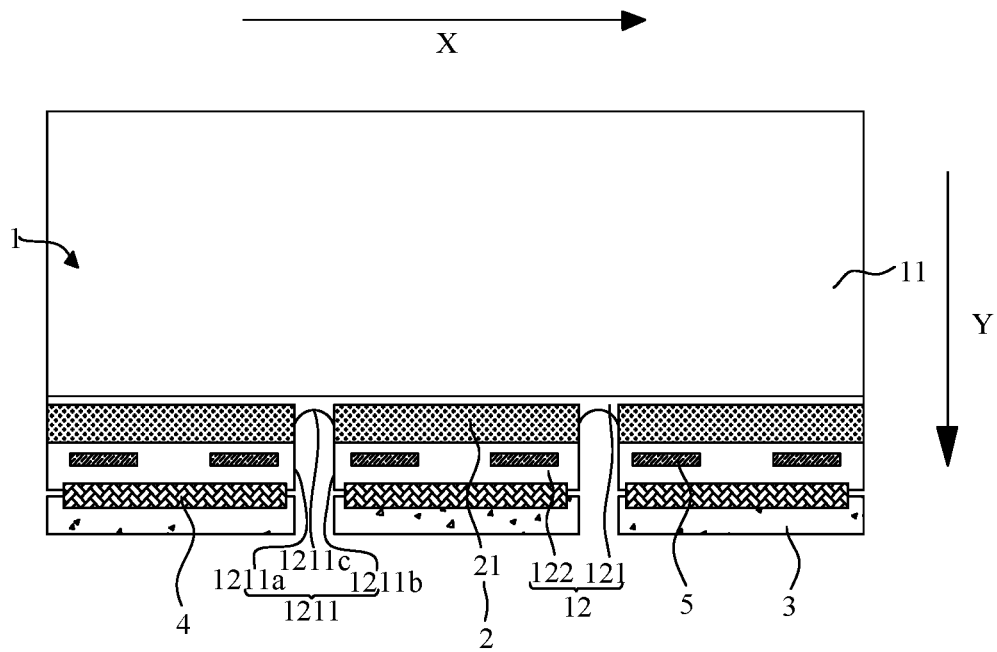

FIG. 8

| Forming a drive backplane, wherein the drive backplane includes a pixel circuit region and a peripheral region disposed outside the pixel circuit region, the peripheral region including a bending region; wherein the bending region and the pixel circuit region are sequentially arranged along a first direction, and the bending region is provided with at least one isolation trench arranged along a second direction, the second direction being intersected with the first direction, and each of the at least one isolation trench extending through the drive backplane |
|---|

S110

| Forming a stress absorbing layer in the bending region, wherein the stress absorbing layer includes a plurality of absorbing portions arranged along the second direction, at least one of the plurality of absorbing portions being provided on both sides of each of the at least one isolation trench |
|---|

DISPLAY PANEL, METHOD FOR MANUFACTURING SAME, AND DISPLAY DEVICE WITH IMPROVED STRESS ABSORBING CAPACITY

CROSS-REFERENCE TO RELATED APPLICATION

This application claims priority to Chinese Patent Application No. 202110097392.8, filed on Jan. 25, 2021 and entitled "DISPLAY DEVICE, DISPLAY PANEL AND METHOD FOR MANUFACTURING SAME," the disclosure of which is herein incorporated by reference in its entirety.

TECHNICAL FIELD

The present disclosure relates to the field of display technologies, and in particular to a display panel, a method for manufacturing the same, and a display device.

BACKGROUND

With the development of display technologies, flexible display panels (Organic light-emitting diode, OLED) have been widely used in display technologies due to their advantages of lightness and thinness, high contrast, flexibility, short response time, and the like. The flexible display panel usually has a display region and a peripheral circuit region outside the display region. To realize a narrow frame design, it is usually necessary to bend the peripheral circuit region to the back of the display region.

SUMMARY

Embodiments of the present disclosure provide a display panel, a method for manufacturing the same, and a display device. The technical solutions are as follows.

In one aspect, a display panel is provided. The display panel includes a drive backplane and a stress absorbing layer; wherein the drive backplane includes a pixel circuit region and a peripheral region disposed outside the pixel circuit region, the peripheral region including a bending region; wherein the bending region and the pixel circuit region are sequentially arranged along a first direction, and the bending region is provided with at least one isolation trench arranged along a second direction, the second direction being intersected with the first direction, and each of the at least one isolation trench extending through the drive backplane; and the stress absorbing layer is disposed in the bending region and includes a plurality of absorbing portions arranged along the second direction, at least one of the plurality of absorbing portions being provided on both sides of each of the at least one isolation trench.

Optionally, the isolation trench includes an open end and a closed end that are arranged along the first direction, the closed end being proximal to the pixel circuit region relative to the open end.

Optionally, the isolation trench includes a first trench wall and a second trench wall that are arranged in parallel, and a bottom wall configured to connect the first trench wall and the second trench wall, the bottom wall being in smooth transition with the first trench wall and the second trench wall.

Optionally, the bottom wall is in an arc shape, and a distance between the first trench wall and the second trench wall is greater than or equal to twice a radius of the bottom wall.

Optionally, the radius of the bottom wall ranges from 0.5 mm to 1 mm.

Optionally, the isolation trench is a through hole, the through hole has a shape of one of a circle, a semicircle, an ellipse, and a waist circle.

Optionally, in the second direction, the isolation trench divides a part of the drive backplane in the bending region into a plurality of bending portions;

wherein the plurality of absorbing portions are in one-to-one correspondence with the plurality of bending portions, each of the absorbing portions is arranged on a corresponding bending portion, and each of the bending portions in a region where the corresponding absorbing portion is disposed is bent along the second direction.

Optionally, each of the absorbing portions is in a strip shape and extends along the second direction.

Optionally, a bending radius of each of the bending portions is less than or equal to 0.3 mm.

Optionally, the stress absorbing layer is a film structure made of an elastic material.

Optionally, the elastic material includes photoresist.

Optionally, the drive backplane includes a substrate and a driving layer disposed on the substrate; wherein the driving layer includes a pixel circuit disposed in the pixel circuit region and a peripheral circuit disposed in the peripheral region, the peripheral circuit being electrically connected to the pixel circuit.

Optionally, the peripheral region further includes an edge region disposed on a side of the bending region distal from the pixel circuit region; wherein the peripheral circuit is disposed in the edge region and is electrically connected to the pixel circuit by running through the bending region.

Optionally, the display panel further includes a driving circuit board and a connection circuit electrically connected to the driving circuit board; wherein on a side, distal from the bending region, of the edge region, the connection circuit board is electrically connected to the peripheral circuit.

Optionally, the display panel further includes a memory disposed in the edge region.

Optionally, the peripheral circuit includes a gate drive circuit and a light-emitting control circuit.

Optionally, the display panel further includes a support portion; wherein the support portion is disposed on a side, distal from the driving layer, of the substrate, and the support portion is configured to support a bent part in the edge region of the drive backplane.

Optionally, the display panel further includes a light-emitting device electrically connected to the pixel circuit.

In another aspect, a method for manufacturing a display panel is provided. The method includes:

forming a drive backplane, wherein the drive backplane includes a pixel circuit region and a peripheral region disposed outside the pixel circuit region, the peripheral region including a bending region; wherein the bending region and the pixel circuit region are sequentially arranged along a first direction, and the bending region is provided with at least one isolation trench arranged along a second direction, the second direction being intersected with the first direction, each of the at least one isolation trench extending through the drive backplane; and forming a stress absorbing layer in the bending region, wherein the stress absorbing layer includes a plurality of absorbing portions arranged along the second direction, at least one of the plurality of absorbing portions being provided on both sides of each of the at least one isolation trench.

In yet another aspect, a display device is provided. The display device includes a power supply component and a display panel; wherein the power supply component is configured to supply power to the display panel, and the display panel includes a drive backplane and a stress absorbing layer; wherein the drive backplane includes a pixel circuit region and a peripheral region disposed outside the pixel circuit region, the peripheral region including a bending region; wherein the bending region and the pixel circuit region are sequentially arranged along a first direction, and the bending region is provided with at least one isolation trench arranged along a second direction, the second direction being intersected with the first direction, and each of the at least one isolation trench extending through the drive backplane;

the stress absorbing layer is disposed in the bending region and includes a plurality of absorbing portions arranged along the second direction, at least one of the plurality of absorbing portions being provided on both sides of each of the at least one isolation trench.

BRIEF DESCRIPTION OF THE DRAWINGS

FIG. 8 is a schematic distributional diagram of a stress absorbing layer in the display panel shown in FIG. 5.

FIG. 9 is a flowchart of a method for manufacturing a display panel according to an embodiment of the present disclosure.

DETAILED DESCRIPTION

Figure 1:
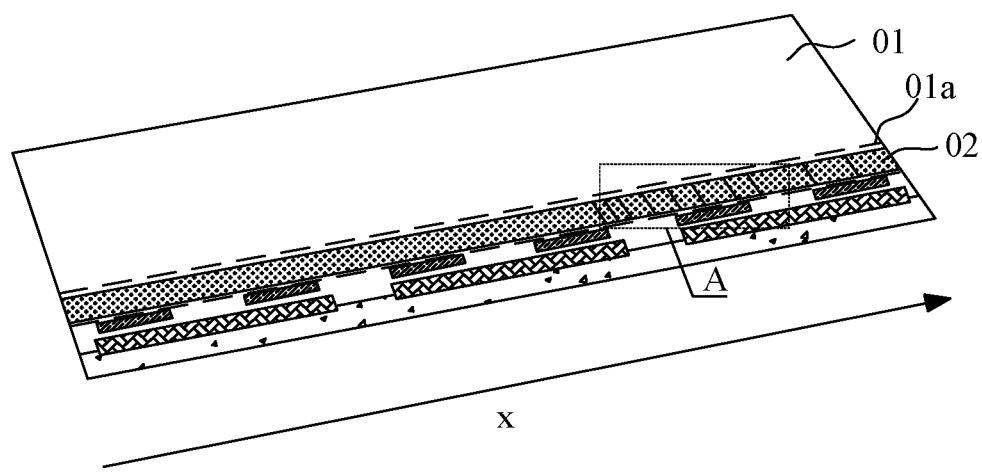
FIG. 1 is a schematic structural diagram of a flexible display panel in the related art.

Exemplary embodiments are further described in detail hereafter with reference to the accompanying drawings. However, the exemplary embodiments can be implemented in various forms, and should not be understood as being limited to the embodiments set forth herein. On the contrary, these embodiments are provided to make the present disclosure comprehensive and complete, and the concept of the exemplary embodiments can be fully conveyed to those skilled in the art. The same reference numerals in the drawings indicate the same or similar structures, and thus their detailed descriptions are omitted. In addition, the drawings are merely schematic illustrations of the present disclosure and are not necessarily drawn to scale.

Although relative terms such as "upper" and "lower" are used in this specification to describe the relative relationship between one component and another component of an icon, these terms are used in this specification only for convenience, for example, the direction of the example shown in the drawings. It can be understood that if a device of an icon is turned upside down, the described "upper" component will become the "lower" component. In the case that a structure is "on" an other structure, it may mean that the structure is integrally formed with the other structure, or that the structure is "directly" disposed on the other structure, or that the structure is "indirectly" disposed on the other structure via another structure.

The terms "a", "an", "the", "said," and "at least one" are intended to indicate the presence of one or more elements/components/and the like. The terms "include" and "comprise" are intended to be inclusive and mean that there may be additional elements/components/and the like other than the listed elements/components/and the like. The terms "first," "second," and the like are used merely as labels, and are not limiting on the number of their objects.

FIG. 1 is a schematic structural diagram of a flexible display panel in the related art. In the related art, the flexible display panel may include a drive backplane 01 and a stress absorbing layer 02. The drive backplane 01 includes a bending region 01a. The stress absorbing layer 02 is disposed in the bending region 01a and is configured to absorb the stress generated when a part of the bending region 01a in the drive backplane 01 is bent.

However, both ends of the bending region 01a are generally flush with both ends of the drive backplane 01, and hence in the x direction, the length of the stress absorbing layer 02 in the bending region 01a is longer. However, when the stress absorbing layer 02 is formed by coating using coating equipment, the stress absorbing layer 02 is influenced by the process limitation of the coating equipment, after the length of the stress absorbing layer 102 in the x direction exceeds a certain threshold, the coating equipment is prone to angular deviation, the uniformity of the stress absorbing layer 02 formed in the bending region 01a is low, the stress absorbing layer 02 is poor in stress absorbing capacity, the part of the drive backplane 01 in the bending region 01a is prone to be broken when being bent, and the yield of flexible panel is low.

Figure 2:
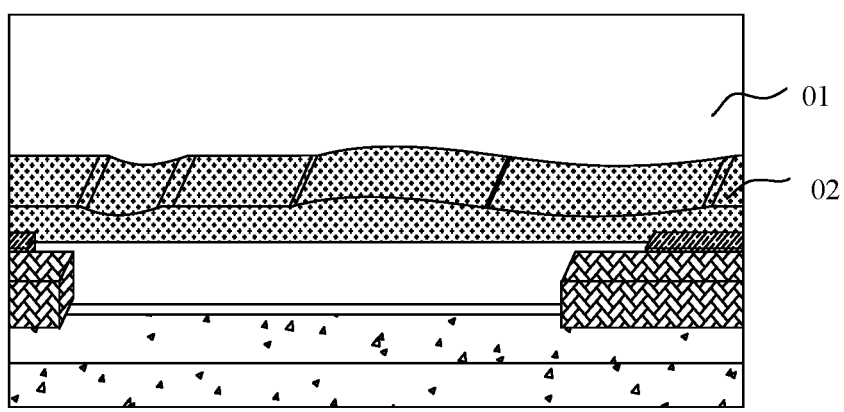
FIG. 2 is a partial enlarged view of the flexible display panel shown in FIG. 1 at a position A.
Figure 3:
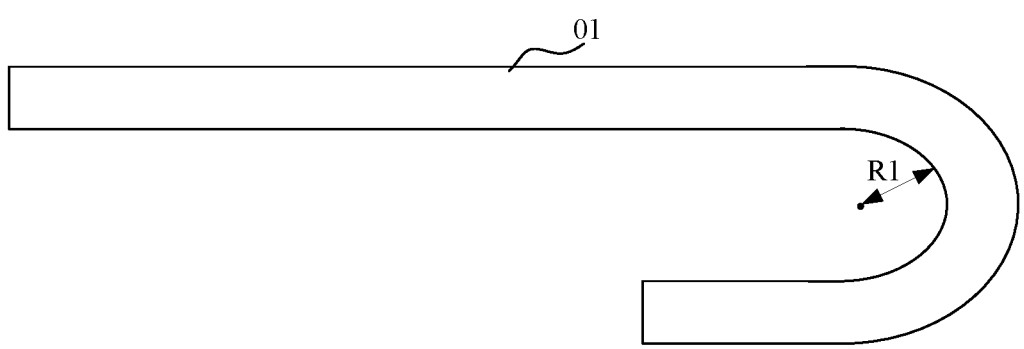
FIG. 3 is a left side view of the flexible display panel shown in FIG. 1 after being bent in a bending region.
Figure 4:
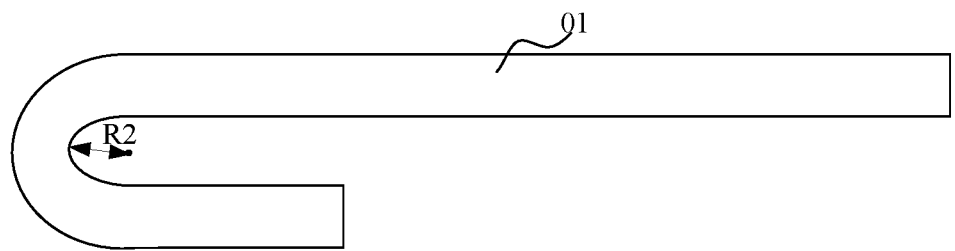
FIG. 4 is a right side view of the flexible display panel shown in FIG. 1 after being bent in a bending region.

In addition, referring to FIG. 2, FIG. 2 is a partial enlarged view of the flexible display panel shown in FIG. 1 at position A. When the uniformity of the stress absorbing layer 02 formed in the bending region 01a is low, the thicknesses of different sections in the stress absorbing layer 02 are not the same. In this way, the bending radius of each section after the part in the bending region 01a in the drive backplane 01 is bent is not consistent. For example, as shown in FIGS. 3 and 4, FIG. 3 is a left side view of the flexible display panel shown in FIG. 1 after being bent in the bending region, and FIG. 4 is a right side view of the flexible display panel shown in FIG. 1 after being bent in the bending region. After the part in the bending region 01a in the drive backplane 01 is bent, the bending radius R1 proximal to the bending region 01a is the same as the bending radius R2 proximal to the other end of the bending region, such that the yield of the flexible panel is further reduced.

It should be noted that FIG. 1 only schematically illustrates the principle that the stress absorbing layer 02 in the related art absorbs the stress generated during the bending of the bending region 01a, such that part of the structure is omitted or simplified, and does not constitute a limitation on the actual structure of the display panel.

Embodiments of the present disclosure provide a display panel, and the display panel may be a flexible display panel that is flexible and bendable. For example, the display panel may be an organic light-emitting diode (OLED) display panel, a micro light-emitting diode (Micro-LED) display panel, and a quantum dot light-emitting diode (QLED)

display panel. In addition, the display panel may also be other flexible display panels that are bendable, which will not be listed here.

Figure 5:
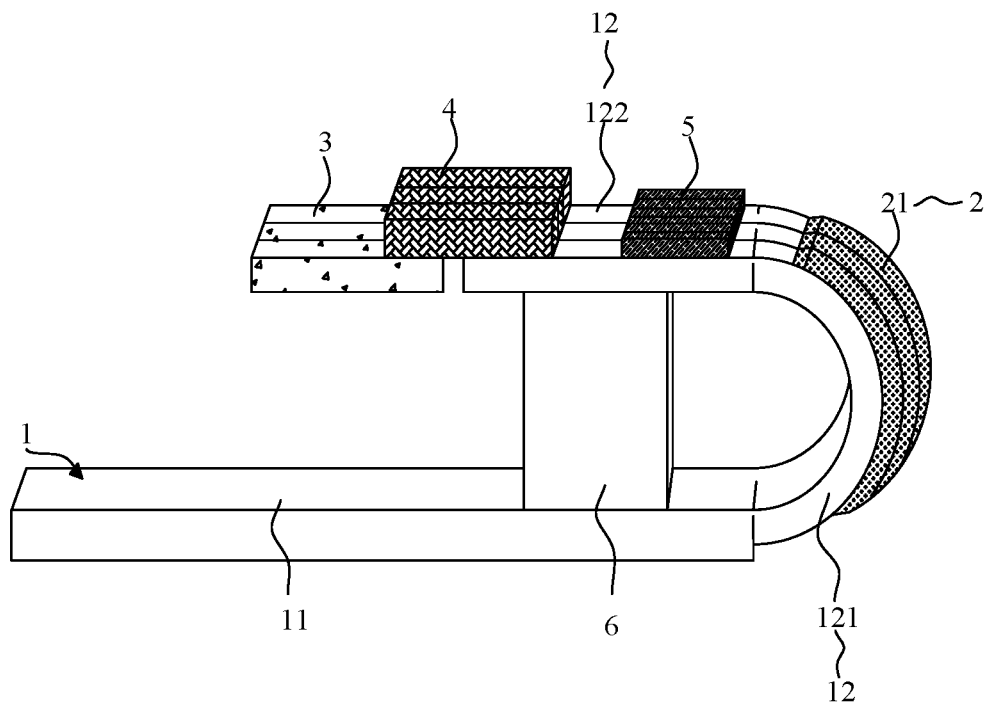
FIG. 5 is a side view of a display panel after being bent according to an embodiment of the present disclosure.
Figure 6:
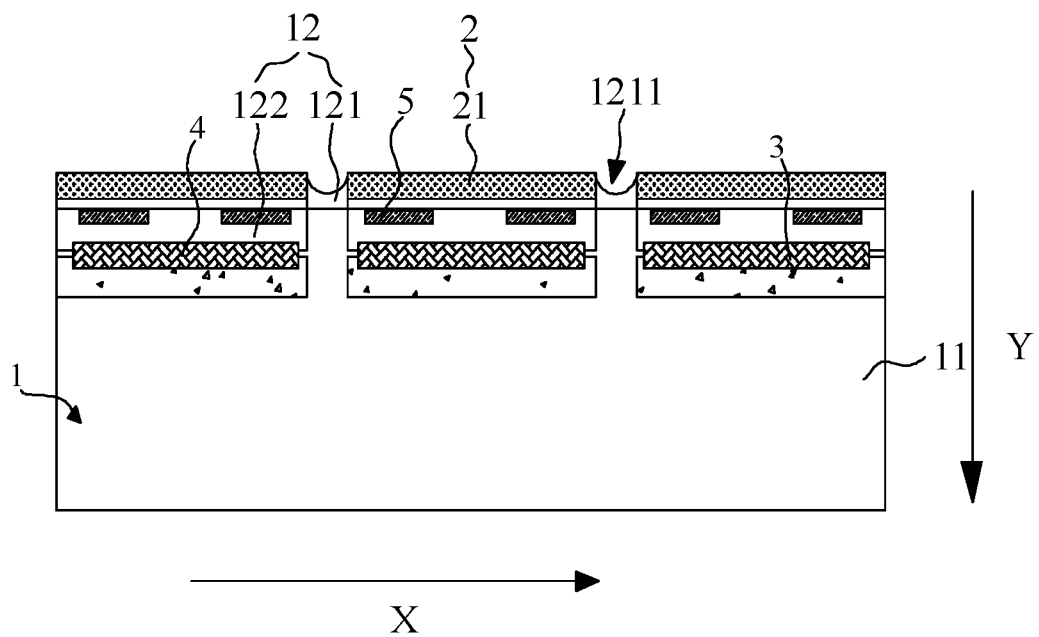
FIG. 6 is a top view of the display panel shown in FIG. 5 after being bent.

Referring to FIGS. 5 and 6, FIG. 5 is a side view of a display panel after being bent according to an embodiment of the present disclosure, and FIG. 6 is a top view of the display panel shown in FIG. 5 after being bent. The display panel may include a drive backplane 1 and a stress absorbing layer 2.

The drive backplane 1 may include a pixel circuit region 11 and a peripheral region 12 disposed outside the pixel circuit region 11. The peripheral region 12 may surround the periphery of the pixel circuit region 11 or may be adjacent to one side of the pixel circuit region 11, which is not particularly limited here. In the present disclosure, the peripheral region 12 may include a bending region 121, the bending region 121, and the pixel circuit region 11 may be sequentially arranged along the first direction Y. The bending region 121 may be provided with at least one isolation trench 1211 arranged along the second direction X, the second direction X being intersected with the first direction Y, and each of the at least one isolation trench 1211 extending through the drive backplane 1. The second direction X is intersected with the first direction Y, and the angle between the second direction X and the first direction Y may range from 45° to 90°. For example, the angle between the second direction X and the first direction Y may be 45°, 60°, or 90°. In addition, the angle between the second direction X and the first direction Y may also be other angles, which will not be listed here. It should be noted that the drawings in the embodiments of the present disclosure are schematically illustrated by taking the angle between the second direction X and the first direction Y being 90° as an example.

The stress absorbing layer 2 may be disposed in the bending region 121, and the stress absorbing layer 2 may include a plurality of absorbing portions 21 arranged along the second direction X. At least one of the plurality of absorbing portions 21 may be provided on both sides of each of the at least one isolation trench 1211 respectively.

In the embodiments of the present disclosure, the at least one isolation trench 1211 is disposed in the bending region 121 and extends along the thickness direction of the drive backplane 1. Therefore, the overall strength of the part in the bending region 121 of the drive backplane 1 can be reduced, the flexibility of the part in the bending region 121 of the drive backplane 1 can be improved, and the risk of breakage in the bending region 121 of the drive backplane 1 can be effectively reduced.

In addition, the at least one isolation trench 1211 is provided in the bending region 121, such that in the second direction X, the length of the absorbing portion 21 disposed on both sides of the at least one isolation trench 1211 is small, and during forming the stress absorbing layer 2 using the coating equipment, the probability of angle deviation in coating equipment can be low. Therefore, the uniformity of the stress absorbing layer 2 and the absorption capacity of the stress are effectively improved, the risk of breakage in the bending region 121 when the drive backplane 1 is bent is further reduced, the thicknesses of different sections of the drive backplane 1 after being bent are approximately the same, and the yield of the display panel is improved.

Besides, the stress absorbing layer 2 can absorb the stress generated when the part in the bending region 121 of the drive backplane 1 is bent and can enhance the elasticity of the part in the bending region 121 of the drive backplane 1, such that the bending radius becomes smaller, the narrow frame design can be realized, and the thickness of the device after being bent can be reduced.

In the embodiments of the present disclosure, various shapes of the isolation trench 1211 may be provided, and the embodiments of the present disclosure will be schematically illustrated by taking the following two cases as examples.

In a first case, the isolation trench 1211 may be a through hole, and the shape of the through hole may be a circle, a semicircle, an ellipse, or a waist circle, and the like. The embodiments of the present disclosure do not particularly limit the shape of the through hole here.

Figure 7:
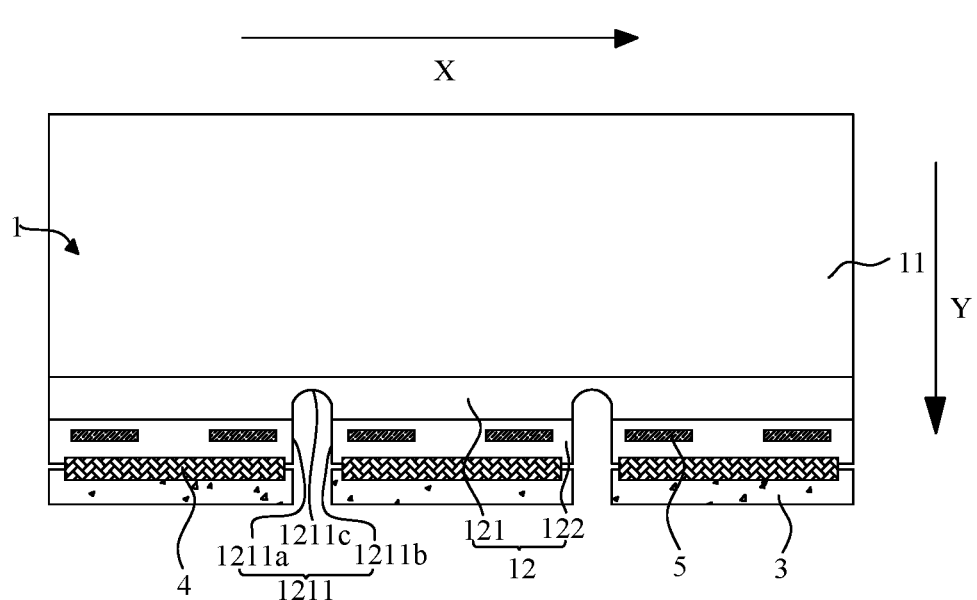
FIG. 7 is a schematic distributional diagram of isolation trenches in the display panel shown in FIG. 5.

In a second case, as shown in FIG. 7, FIG. 7 is a schematic distributional diagram of the isolation trenches in the display panel shown in FIG. 5. The isolation trench 1211 may be a trench-shaped structure with an open end and a closed end. The trench-shaped structure may be a straight trench or an inclined trench, which is not particularly limited here. It should be noted that the following embodiments are all described by taking the isolation trench 1211 as a trench-shaped structure as an example.

The open ends and closed ends of the isolation trench 1211 may be arranged along the first direction Y. The closed end of the isolation trench 1211 may be proximal to the pixel circuit region 11 relative to the open end. That is, the open end is disposed at the edge of the peripheral region 12 distal from the pixel circuit region 11. That is, the opening at the open end of the isolation trench 1211 faces away from the pixel circuit region 11 and is disposed at the edge of the peripheral region 12. In this way, the part in the bending region 121 of the drive backplane 1 may be divided into a plurality of bending portions in the second direction X by the isolation trenches 1211. In this way, when the drive backplane 1 is bent, each bending portion may be bent section by section, such that the difficulty of the bending process can be reduced.

In this case, as shown in FIG. 8, FIG. 8 is a schematic distributional diagram of the stress absorbing layer in the display panel shown in FIG. 5. A plurality of absorbing portions 21 in the stress absorbing layer 2 may be arranged side by side. Each absorbing portion 21 may be in a strip shape, and each absorbing portion 21 may extend along the second direction X. In the second direction X, an absorbing portion 21 may be provided on both sides of each of the isolation trenches 1211. The number of isolation trenches 1211 provided in the bending region 121 may be one, two, three, or four, and may be another number, which is not particularly limited here. When a plurality of isolation trenches 1211 are provided, the plurality of isolation trenches 1211 may be spaced apart along the second direction X. In this way, each absorbing portion 21 and each isolation trench 1211 may be alternately arranged along the second direction X.

Exemplarily, the plurality of absorbing portions 21 in the stress absorbing layer 2 may be in one-to-one correspondence with the plurality of bending portions in the bending region 121. Each absorbing portion 21 in the stress absorbing layer 2 may be arranged on a corresponding bending portion, and each of the bending portions in a region where the corresponding absorbing portion 21 is disposed may be bent along the second direction X. In this way, during the bending of each bending portion in the second direction X, the bending radius of each bending portion may be approximately equal, such that the bending radius of the entire bending region 121 in the drive backplane 1 may be always consistent. In the embodiments of the present disclosure, the bending radius of each bending portion 21 may be less than or equal to 0.3 mm, such that the bending radius can be greatly reduced compared with the related art.

Optionally, the stress absorbing layer 2 in the display panel may be a film structure made of an elastic material. The stress absorbing layer 2 may be attached to a surface of the bending region 121 of the drive backplane 1. When the part in the bending region 121 of the drive backplane 1 is bent in the second direction X, the stress absorbing layer 2 may be bent synchronously with the bending region 121 to absorb the stress generated during the bending. The stress absorbing layer 2 may be a film formed on the surface of the bending region 121 of the drive backplane 1, or a coating formed on the surface of the bending region 121 of the drive backplane 1, which is not particularly limited here. For example, the elastic material for making the stress absorbing layer 2 may include photoresist.

In the embodiments of the present disclosure, as shown in FIG. 7, the isolation trench 1211 may include a first trench wall 1211a, a second trench wall 1211b, and a bottom wall 1211c. The first trench wall 1211a may be arranged in parallel with the second trench wall 1211b, the bottom wall 1211c may be configured to connect the first trench wall 1211a and the second trench wall 1211b, and the bottom wall 1211c is in smooth transition with the first trench wall 12111a and the second trench wall 1211b. For example, the bottom wall 1211c may be a smooth curved surface, such that the risk of breakage can be reduced due to the existence of the ribs when the drive backplane 1 is bent.

Exemplarily, the isolation trench 1211 may be a straight trench, and both the first trench wall 1211a and the second trench wall 1211b may extend along the second direction X perpendicular to the first direction Y. The bottom wall 1211c may be in an arc shape, such that when the drive backplane 1 is bent, all parts of the bottom wall 1211c being uniformly stressed can be ensured and the risk of fracture to the bottom wall 1211c can be further reduced. For example, the isolation trench 1211 may be a U-shaped trench.

To form a U-shaped trench with uniform stress on all parts of the bottom wall, the distance between the first trench wall 1211a and the second trench wall 1211b may be greater than or equal to twice a radius of the bottom wall 1211c. For example, the radius of the bottom wall 1211c may range from 0.5 millimeters (mm) to 1 mm, such as 0.5 mm, 0.6 mm, 0.7 mm, 0.8 mm, 0.9 mm, or 1 mm. The distance between the first trench wall 1211a and the second trench wall 1211b may range from 1 mm to 2 mm, such as 1 mm, 1.2 mm, 1.4 mm, 1.6 mm, 1.8 mm, or 2 mm.

The formation of the isolation trench 1211 will be described as follows:

A laser cutting process may be used to cut the surface of the drive backplane 1 to form the isolation trench 1211. In addition, other processes may also be used to cut the surface of the drive backplane 1 to form the isolation trench 1211, as long as other structures of the drive backplane 1 are not damaged, which is not particularly limited here. For example, the drive backplane 1 may be cut along the first direction Y in the peripheral region 12 to form the isolation trench 1211. For example, a laser cutting process is used to cut the substrate disposed in the peripheral region 12 of the drive backplane along the first direction Y, and in this process, the substrate may be cut through in the thickness direction of the substrate to relieve the stress and reduce the strength around the isolation trench 1211, such that the flexibility of the part in the bending region 121 of the drive backplane 1 can be improved.

It should be noted that the radius of the bottom wall 1211c and the distance between the first trench wall 1211a and the second trench wall 1211b may be adjusted according to the cutting accuracy of the equipment. Taking the laser cutting process as an example, in the case that the minimum radius of the arc formed by the laser cutting equipment is 0.5 mm, the radius of the bottom wall 1211c may be greater than or equal to 0.5 mm, and the distance between the first trench wall 1211a and the second trench wall 1211b may be greater than or equal to 1 mm; in the case that the minimum radius of the arc formed by the laser cutting equipment is 1 mm, the radius of the arc of the bottom wall 1211c may be greater than or equal to 1 mm, and the distance between the first trench wall 1211a and the second trench wall 1211b may be greater than or equal to 2 mm.

In other embodiments, the bottom wall 1211c may extend along the second direction X, and both ends of the bottom wall 1211c may be in smooth transition with the first trench wall 12111a and the second trench wall 1211b, that is, the both ends of the bottom wall 1211c may be connected to the first trench wall 1211a and the second trench wall 1211b by chamfering.

The radius of the chamfering and the distance between the first trench wall 1211a and the second trench wall 1211b may be adjusted according to the cutting accuracy of the equipment. Taking the laser cutting process as an example, in the case that the minimum radius of the chamfering formed by the laser cutting equipment is 0.5 mm, the radius of the chamfering of the bottom wall 1211c may be greater than or equal to 0.5 mm, and the distance between the first trench wall 1211a and the second trench wall 1211b may be greater than 1 mm; in the case that the minimum radius of the chamfering formed by the laser cutting equipment is 1 mm, the radius of the chamfering of the bottom wall 1211c may be greater than or equal to 1 mm, and the distance between the first trench wall 1211a and the second trench wall 1211b may be greater than 2 mm.

In the embodiments of the present disclosure, the drive backplane 1 may include a substrate and a driving layer disposed on the substrate. The substrate may be made of polyimide (PI) flexible material, and the substrate may be a single-layer or a multi-layer structure, which is not particularly limited here. The driving layer may include a pixel circuit disposed in the pixel circuit region 11 and a peripheral circuit disposed in the peripheral region 12. The peripheral circuit may be electrically connected to the pixel circuit.

Exemplarily, a plurality of pixel circuits may be provided in the pixel circuit region 11, and the plurality of pixel circuits may be arranged in an array in the pixel circuit region 11. The peripheral circuits may include a gate drive circuit and a light-emitting control circuit. The gate drive circuit may be electrically connected to each pixel circuit, and the light-emitting control circuit may also be electrically connected to each pixel circuit.

In the present disclosure, as shown in FIG. 7, except for the bending region 121, the peripheral region 12 of the drive backplane 1 may also include an edge region 122 disposed on a side of the bending region 121 distal from the pixel circuit region 11. The peripheral circuit may be disposed in the edge region 122, such that the peripheral circuit may be connected to the pixel circuit by running through the bending region 121. In the manufacturing process of the display panel, the bending region 121 of the backplane needs to be bent, such that the edge region 122 of the backplane is bent to the side of the substrate distal from the driving layer. The peripheral circuit running through the bending region 121 may be arranged outside each of the isolation trenches 1211, that is, the peripheral circuit is not overlapped with the isolation trench 1211 to ensure that the peripheral circuit is not damaged when the isolation trenches 1211 are formed.

Optionally, the display panel may further include a light-emitting device electrically connected to the pixel circuit. A plurality of the light-emitting device may be provided, and the plurality of light-emitting devices may be arranged in the pixel circuit region 11 and be electrically connected to a plurality of pixel circuits in a one-to-one correspondence. The light-emitting device layer where the plurality of light-emitting devices are disposed may be arranged on the side of the driving layer distal from the substrate. Exemplarily, the light-emitting device may be an OLED light-emitting device, which may include a first electrode, a light-emitting functional layer, and a second electrode that are stacked. When electrical signals are input to the first electrode and the second electrode in the light-emitting device through the peripheral circuit and the pixel electrode, the light-emitting functional layer may emit light, thereby realizing image display.

Optionally, as shown in FIG. 5, the display panel may further include a driving circuit board 3 and a connection circuit board 4 electrically connected to the driving circuit board 3. The connection circuit board 4 may be electrically connected to the peripheral circuit on the side of the edge region 122 distal from the bending region 121. In this way, the driving circuit board 3 may be electrically connected to the peripheral circuit in the edge region 122 through the connection circuit board 4, such that the driving circuit board 3 may send drive signals to the gate drive circuit and the light-emitting control circuit in the peripheral circuit through the connection circuit board 4. As the gate drive circuit and the light-emitting control circuit are both connected to the pixel circuit, electrical signals may be input to the first electrode and the second electrode of the light-emitting device through the gate drive circuit, the light-emitting control circuit, and the pixel circuit, to drive the light-emitting functional layer to emit light. Exemplarily, the driving circuit board 3 may be a printed circuit board (PCB) board.

In the embodiments of the present disclosure, as shown in FIG. 5, the display panel may further include a memory 5 disposed in the edge region 122. Exemplarily, the memory 5 may overlie in the edge region 122 and connected to the peripheral circuit, and the memory 5 may be configured to store drive signals. A plurality of memories 5 in the display panel may be provided, and the plurality of memories 5 may be uniformly arranged along the second direction X, and at least one memory is arranged between every two adjacent isolation trenches 1211.

To support the part in the edge region 122 of the drive backplane 1 after being bent, the display panel of the present disclosure may further include a support portion 6. The support portion 6 may be disposed on a side distal from the driving layer, of the substrate, and the support portion 6 may be configured to support a bent part in the edge region 122 of the drive backplane 1, to prevent the part in the edge region 122 of the drive backplane 1 from being suspended, to prevent the part in the bending region 121 of the drive backplane 1 from being broken when the part in the edge region 122 of the drive backplane 1 is stressed.

Exemplarily, the support portion 6 may be in a strip shape, and the support portion 6 may extend in the second direction X. The two ends of the support portion 6 may be flush with the two ends of the edge region 122, such that all parts in the edge region 122 being fully supported are ensured to avoid suspending. To prevent the support portion 6 from scratching the part in the edge region 122 of the bent drive backplane 1, the support portion 6 may be made of an elastic material, for example, the support portion 6 may be an elastic rubber strip.

In summary, the display panel according to the embodiments of the present disclosure includes a drive backplane and a stress absorbing layer. At least one isolation trench is arranged in the bending region of the drive backplane. The at least one isolation trench extends along the thickness direction of the drive backplane, such that the overall strength of the part in the bending region of the drive backplane can be reduced, the flexibility of the part in the bending region of the drive backplane can be improved, and the risk of fracture of the drive backplane in the bending region can be effectively reduced when the drive backplane is bent. In addition, the at least one isolation trench is provided in the bending region, the length of the absorbing portion disposed at both sides of each of the at least one isolation trench in the second direction is small, such that in the process of forming the stress absorbing layer by using coating equipment, the probability of the coating equipment being prone to angular deviation is low. In this way, the uniformity of the stress absorbing layer and the ability to absorb stress is effectively improved, the risk of breakage in the bending region when the drive backplane is bent is further reduced, the thickness of different sections after the drive backplane is bent being approximately the same can be ensured, and the yield of the display panel is improved.

The embodiments of the present disclosure also provide a method for manufacturing a display panel. The display panel may be the display panel in any of the above embodiments, the structure of which is not described in detail here. As shown in FIG. 9, the manufacturing method includes the following steps.

In S110, forming a drive backplane, wherein the drive backplane includes a pixel circuit region and a peripheral region disposed outside the pixel circuit region, the peripheral region including a bending region; wherein the bending region and the pixel circuit region are sequentially arranged along a first direction, the bending region is provided with at least one isolation trench arranged along a second direction, the second direction being intersected with the first direction, and each of the at least one isolation trench extending through the drive backplane.

In S120, forming a stress absorbing layer in the bending region, wherein the stress absorbing layer includes a plurality of absorbing portions arranged along the second direction, at least one of the plurality of absorbing portions being provided on both sides of each of the at least one isolation trench.

A laser cutting process may be used to cut a surface of the drive backplane to form the isolation trenches. In addition, other processes may also be used to cut the surface of the drive backplane to form the isolation trenches, as long as other structures of the drive backplane are not damaged, which is not particularly limited here.

For the specific details and beneficial effects of the display panel in the manufacturing method of the present disclosure, reference may be made to the above embodiments of the display panel, which will not be described in detail here.

It should be noted that although the various steps of the manufacturing method in the present disclosure are described in a specific order in the drawings, this does not require or imply that these steps must be performed in the specific order, or that all the steps shown must be performed, to achieve the desired result. Additionally or alternatively, some steps may be omitted, multiple steps may be combined into one step for execution, and/or one step may be decomposed into multiple steps for execution, and the like. The embodiments of the present disclosure also provide a display device, the display device may include the display panel in any of the above-mentioned embodiments, the structure of which may refer to the above-mentioned embodiments of the display panel, which will not be described in detail here.

The display device of the present disclosure may be an electronic device with a display function such as a mobile phone, a tablet computer, a TV, and the like, which will not be listed here. The display device may include a power supply component and the display panel shown in the above embodiments. The power supply component is configured to supply power to the display panel.

After considering the specification and practicing the present disclosure disclosed herein, those skilled in the art will easily think of other embodiments of the present disclosure. The present disclosure is intended to cover any variations, uses, or adaptive changes of the present disclosure. These variations, uses, or adaptive changes follow the general principles of the present disclosure and include common knowledge or customary technical means in the technical field that are not described in the present disclosure. The description and the embodiments are only regarded as exemplary, and the true scope and spirit of the present disclosure are pointed out by the appended claims.

What is claimed is:

1. A display panel, comprising a drive backplane and a stress absorbing layer; wherein
the drive backplane comprises a pixel circuit region and a peripheral region disposed outside the pixel circuit region, the peripheral region comprising a bending region; wherein the bending region and the pixel circuit region are sequentially arranged along a first direction, and the bending region is provided with at least one isolation trench arranged along a second direction, the second direction being intersected with the first direction, and each of the at least one isolation trench extending through the drive backplane; and
the stress absorbing layer is disposed in the bending region and comprises a plurality of absorbing portions arranged along the second direction, at least one of the plurality of absorbing portions being provided on both sides of each of the at least one isolation trench,
wherein the isolation trench comprises an open end and a closed end that are arranged along the first direction, the closed end being proximal to the pixel circuit region relative to the open end, and wherein the isolation trench comprises a first trench wall and a second trench wall that are arranged in parallel, and a bottom wall configured to connect the first trench wall and the second trench wall, the bottom wall being in smooth transition with the first trench wall and the second trench wall, the bottom wall is in an arc shape, and a distance between the first trench wall and the second trench wall is greater than or equal to twice a radius of the bottom wall.

2. The display panel according to claim 1, wherein the radius of the bottom wall ranges from 0.5 mm to 1 mm.

3. The display panel according to claim 1, wherein in the second direction, the isolation trench divides a part of the drive backplane in the bending region into a plurality of bending portions;
wherein the plurality of absorbing portions are in one-to-one correspondence with the plurality of bending portions, each of the absorbing portions is arranged on a corresponding bending portion, and each of the bending portions in a region where the corresponding absorbing portion is disposed is bent along the second direction.

4. The display panel according to claim 3, wherein each of the absorbing portions is in a strip shape and extends along the second direction.

5. The display panel according to claim 3, wherein a bending radius of each of the bending portions is less than or equal to 0.3 mm.

6. The display panel according to claim 1, wherein the stress absorbing layer is a film structure made of an elastic material.

7. The display panel according to claim 6, wherein the elastic material comprises photoresist.

8. The display panel according to claim 1, wherein the drive backplane comprises a substrate and a driving layer disposed on the substrate;
wherein the driving layer comprises a pixel circuit disposed in the pixel circuit region and a peripheral circuit disposed in the peripheral region, the peripheral circuit being electrically connected to the pixel circuit.

9. The display panel according to claim 8, wherein the peripheral region further comprises an edge region disposed on a side of the bending region distal from the pixel circuit region;
wherein the peripheral circuit is disposed in the edge region and is electrically connected to the pixel circuit by running through the bending region.

10. The display panel according to claim 9, further comprising a driving circuit board and a connection circuit electrically connected to the driving circuit board;
wherein on a side, distal from the bending region, of the edge region, the connection circuit board is electrically connected to the peripheral circuit.

11. The display panel according to claim 10, further comprising a memory disposed in the edge region.

12. The display panel according to claim 11, further comprising a support portion;
wherein the support portion is disposed on a side, distal from the driving layer, of the substrate, and the support portion is configured to support a bent part in the edge region of the drive backplane.

13. The display panel according to claim 12, further comprising a light-emitting device electrically connected to the pixel circuit.

14. The display panel according to claim 10, wherein the peripheral circuit comprises a gate drive circuit and a light-emitting control circuit.

15. A method for manufacturing a display panel, comprising:
forming a drive backplane, wherein the drive backplane comprises a pixel circuit region and a peripheral region disposed outside the pixel circuit region, the peripheral region comprising a bending region; wherein the bending region and the pixel circuit region are sequentially arranged along a first direction, and the bending region is provided with at least one isolation trench arranged along a second direction, the second direction being intersected with the first direction, and each of the at least one isolation trench extending through the drive backplane; and
forming a stress absorbing layer in the bending region, wherein the stress absorbing layer comprises a plurality of absorbing portions arranged along the second direction, at least one of the plurality of absorbing portions being provided on both sides of each of the at least one isolation trench, wherein the isolation trench comprises an open end and a closed end that are arranged along the first direction, the closed end being proximal to the pixel circuit region relative to the open end, and wherein the isolation trench comprises a first trench wall and a second trench wall that are arranged in parallel, and a bottom wall configured to connect the first trench wall and the second trench wall, the bottom wall being in smooth transition with the first trench wall and the second trench wall, the bottom wall is in an arc shape, and a distance between the first trench wall and the second trench wall is greater than or equal to twice a radius of the bottom wall.

16. A display device, comprising a power supply component and a display panel; wherein the power supply component is configured to supply power to the display panel, and the display panel comprises a drive backplane and a stress absorbing layer; wherein the drive backplane comprises a pixel circuit region and a peripheral region disposed outside the pixel circuit region, the peripheral region comprising a bending region; wherein the bending region and the pixel circuit region are sequentially arranged along a first direction, and the bending region is provided with at least one isolation trench arranged along a second direction, the second direction being intersected with the first direction, and each of the at least one isolation trench extending through the drive backplane; and the stress absorbing layer is disposed in the bending region and comprises a plurality of absorbing portions arranged along the second direction, at least one of the plurality of absorbing portions being provided on both sides of each of the at least one isolation trench, wherein the isolation trench comprises an open end and a closed end that are arranged along the first direction, the closed end being proximal to the pixel circuit region relative to the open end, and wherein the isolation trench comprises a first trench wall and a second trench wall that are arranged in parallel, and a bottom wall configured to connect the first trench wall and the second trench wall, the bottom wall being in smooth transition with the first trench wall and the second trench wall, the bottom wall is in an arc shape, and a distance between the first trench wall and the second trench wall is greater than or equal to twice a radius of the bottom wall.

\* \* \* \* \*